United States Patent
Bailey et al.

(10) Patent No.: US 12,352,784 B2
(45) Date of Patent: Jul. 8, 2025

(54) SYSTEM AND METHOD FOR HIGH PERFORMANCE DISTRIBUTION OF LARGE WAVEFORM CAPTURES TO MULTIPLE VIEWERS

(71) Applicant: Tektronix, Inc., Beaverton, OR (US)

(72) Inventors: James R. Bailey, Grayson, GA (US); Frederick B. Kuhlman, III, Nashville, TN (US); Thomas Buida, Nashville, TN (US); Adam M. Reeves, Nashville, TN (US); Gary J. Waldo, Hillsboro, OR (US)

(73) Assignee: Tektronix, Inc., Beaverton, OR (US)

(*) Notice: Subject to any disclaimer, the term of this patent is extended or adjusted under 35 U.S.C. 154(b) by 629 days.

(21) Appl. No.: 17/531,335

(22) Filed: Nov. 19, 2021

(65) Prior Publication Data
US 2022/0163566 A1 May 26, 2022

Related U.S. Application Data

(60) Provisional application No. 63/117,202, filed on Nov. 23, 2020.

(51) Int. Cl.
*G01R 13/02* (2006.01)
*G01R 19/25* (2006.01)
*H03M 7/30* (2006.01)

(52) U.S. Cl.
CPC ..... *G01R 13/0218* (2013.01); *G01R 19/2509* (2013.01); *H03M 7/30* (2013.01)

(58) Field of Classification Search
CPC .. G01R 13/0218; G01R 13/00; G01R 13/029; G01R 19/2509; H03M 7/30
See application file for complete search history.

(56) References Cited

U.S. PATENT DOCUMENTS

| 7,071,852 B1* | 7/2006 | Wegener ............. G01R 13/02 341/61 |
| 2017/0269147 A1* | 9/2017 | Rezgui ............... G01R 15/00 |
| 2018/0074096 A1* | 3/2018 | Absher ............... G01R 23/16 |

OTHER PUBLICATIONS

Sparkfun, How to Use an Oscilloscope (2015) https://learn.sparkfun.com/tutorials/how-to-use-an-oscilloscope/all (Year: 2015).*

* cited by examiner

*Primary Examiner* — Son T Le
*Assistant Examiner* — Brian Butler Geiss
(74) *Attorney, Agent, or Firm* — Miller Nash LLP; Andrew J. Harrington

(57) ABSTRACT

A test and measurement device has a communications port configured to connect the test and measurement device to a network, a memory, and one or more processors configured to execute code to cause the processors to receive an original waveform through the communications port, the original waveform having an identified file type, store the original waveform in the memory, the original waveform having an original file size, compress the original waveform to a compressed waveform having a compressed file size that is smaller than the original file size, notify one or more users that the compressed waveform is available, and upon receiving a request, transmitting the compressed waveform to a user device. A method of providing waveform data across a network includes receiving an original waveform through a communications port, the original waveform having an identified file type, storing the original waveform in a memory, the original waveform having an original file size, compressing the original waveform to a compressed waveform having a compressed file size that is smaller than the original file size, notifying one or more users that the compressed waveform is available, and upon receiving a request, transmit the compressed waveform to a user device.

11 Claims, 2 Drawing Sheets

SYSTEM AND METHOD FOR HIGH PERFORMANCE DISTRIBUTION OF LARGE WAVEFORM CAPTURES TO MULTIPLE VIEWERS

PRIORITY

This disclosure claims benefit of U.S. Provisional Application No. 63/117,202, titled "METHOD FOR HIGH PERFORMANCE DISTRIBUTION OF LARGE WAVEFORM CAPTURES TO MULTIPLE VIEWERS," filed on Nov. 23, 2020, the disclosure of which is incorporated herein by reference in its entirety.

TECHNICAL FIELD

This disclosure relates to test and measurement systems, and more particularly to a cloud-based component of a test and measurement system.

BACKGROUND

Test and measurement instruments, such as oscilloscopes ("scopes"), often generate dense, large waveforms that are difficult to share to another scope/computer/viewer/user due to their size, typically on the order of gigabytes. When sharing to other devices/people is necessary, a static screenshot of the waveform, typically in the form of an image file such as a bitmap, JPEG, PNG, etc., is often sent to get around the practical size limitations of sending the actual waveform data. Measurements, zooming in for details, data transformations, etc. are difficult or impossible with static screenshot images, greatly limiting data analysis for anyone who does not have the original, raw scope waveform file.

A cloud data service, such as TekCloud™ for example, provides the advantage of easily distributing oscilloscope data captures, such as waveform files, to multiple users/viewers. While the example used here comprises waveform data from an oscilloscope, it could comprise any data generated by a test and measurement instrument. Providing the waveform file to multiple users allows team collaboration for troubleshooting and analysis. However, downloading multi-gigabyte waveforms for analysis is a time-consuming and poor user experience. Once downloaded, specialized installed software applications, such as TekScope™ for example, may be required to effectively open, view, and manipulate such large files.

Within a collaborative team, installing specialized software on every team member's computer may be impractical or, at a minimum, inconvenient due to company IT policies. Also, such specialized software may not be available on some computer types or configurations. This limits the possibilities of data analysis collaboration.

A better approach to a collaborative workflow is to provide software tools that do not require installation and are universally supported across devices/configurations, for example web browser-based tools such as those found in today's SaaS solutions. However, web browser-based applications have limits on memory management that make loading and viewing multi-gigabyte waveform files with good performance extremely difficult or impossible.

Embodiments of the disclosed technology address these and other shortcomings of the prior art.

DETAILED DESCRIPTION

Embodiments of the disclosure generally include selective server-side processing of large waveform files to allow flexible sharing with, and collaboration amongst, multiple users. An example user workflow, according to some embodiments of the disclosure, a test and measurement instrument, also referred to here as an instrument, such as an oscilloscope, acquires a waveform.

The instrument uploads the waveform to a cloud service, such as TekDrive™, with an identifier of the file type. The identifier may comprise the file extension, manually specified by the user, or automatically detected on inspection. The cloud service may notify multiple users of its availability. These users may have subscribed or otherwise previously requested the waveform, or the instrument may "belong" to a particular group of users, as examples of how the cloud service knows to notify the users. Once uploaded, the cloud service compresses the waveform and users can share the compressed waveform. This saves bandwidth and reduces the overall load on the system. Collaboration becomes more practical and fast.

As used here, the terms "cloud service" or "cloud" means one or more servers, each having one or more processors that operate on the data received over a network connection from the test and measurement instrument. The network may comprise a closed network, meaning it is only available to users of a particular company, building, or network, or an open network, a virtual private network, etc. The user devices and the instrument may connect through wired or wireless network links to the network, or by near-field communications, infrared, or Bluetooth®.

Figure 1:
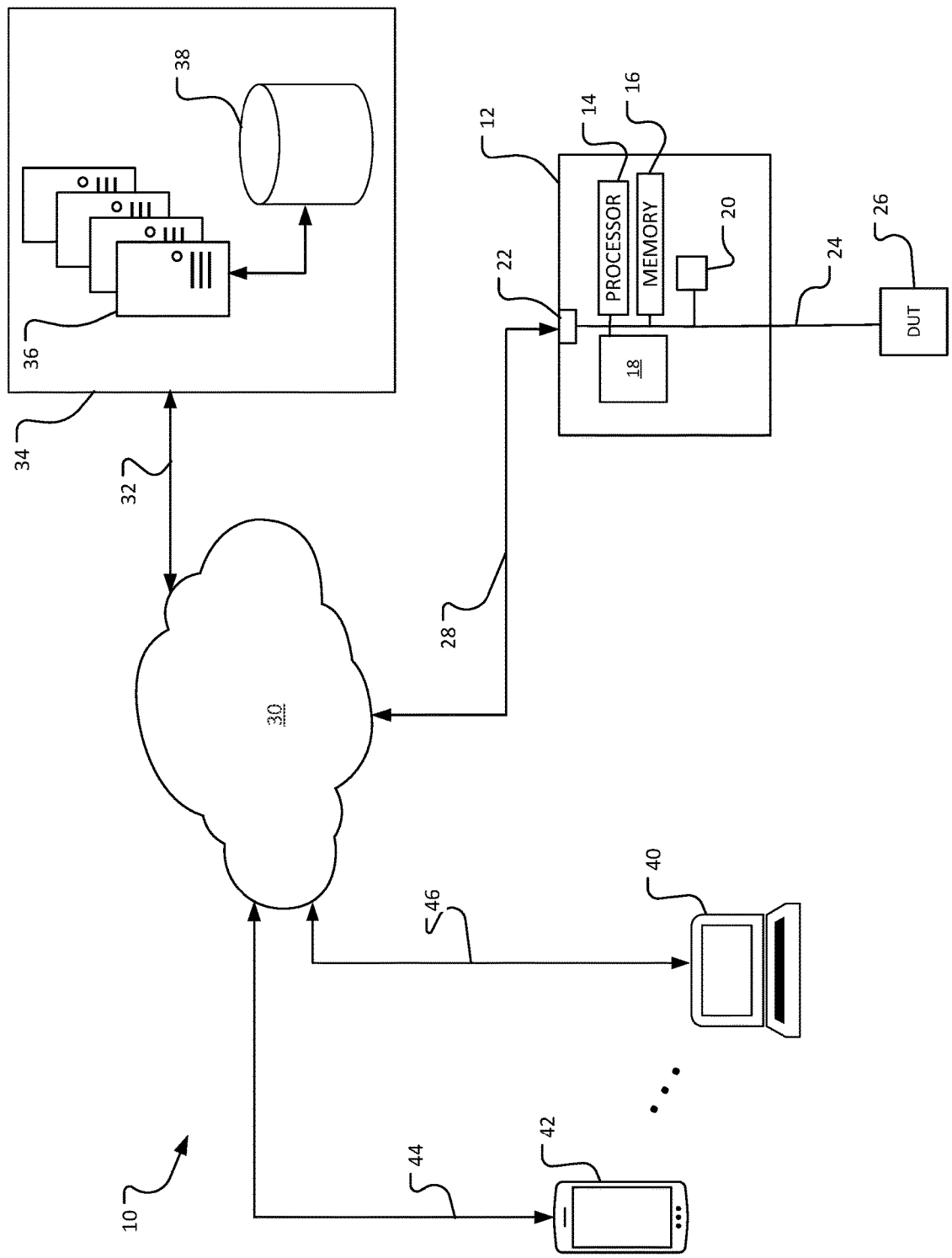
FIG. 1 shows a system including a test and measurement instrument connected to a cloud-based server and a remote user device.

FIG. 1 shows an embodiment of system 10 within which an instrument connects to a cloud service. A test and measurement instrument 12 has a processor 14, a memory 16, a display 18 and a user interface 20, which may exist as part of a touch-screen display, or take the form of control knobs and other user input devices. The instrument will typically have at least one device under test 26 connected to it by cables or other connection 24. The testing and/or analysis of this device results in the waveform for upload to the cloud. The network port 22 and the connection 28 allow the instrument to upload the waveform to the cloud service by the network 30. The cloud service 34 also connects to the network 30 by connection 32.

The cloud or cloud service 34 may comprise one or more servers such as 36, each of which may have one or more processors. Each server may have its own dedicated memory, or it may share a common storage 38, or both. The memory allows the cloud to store the original waveform in its native form, and one or more compressed and/or segmented data files based on the original waveform discussed below. Once uploaded, multiple users may simultaneously, at least partially simultaneously, or sequentially, download the compressed file to work with it. User devices such as 40 and 42, connected to the cloud by network connections 46 and 44, respectively. Many more than just those devices may use the waveform.

Figure 2:
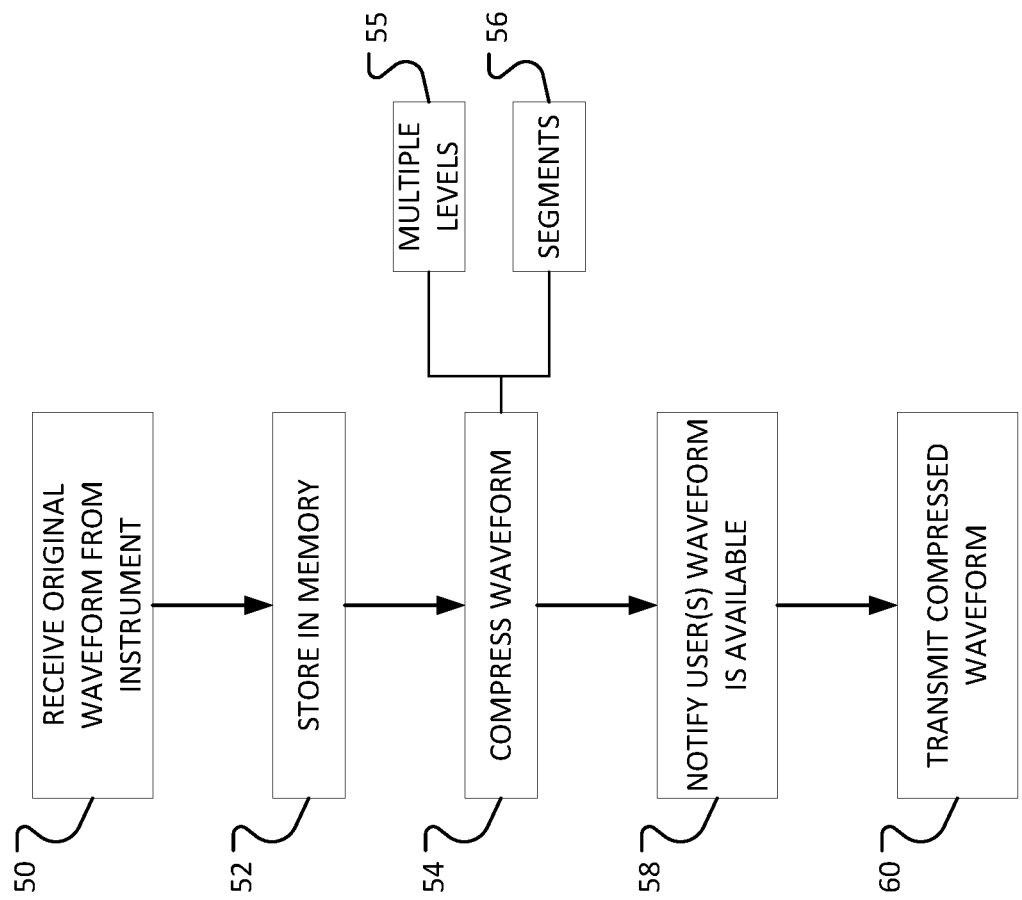
FIG. 2 shows a flowchart of an embodiment of a method to compress a waveform file.

The overall process may comprise one workflow, but for ease of discussion, the discussion will address the upload and compression first, and then the download and management of the waveform in its various forms. FIG. 2 shows an embodiment of a method of uploading and compressing the waveform data into one or more compressed versions. The term "compression" as used here means any method of reducing the file size. This may include lossy or lossless compression. Lossless compression typically retains values and manages to lower the file size, such as LZ77. Lossy compression typically reduces file size by eliminating redundant information and may include JPEG (Joint Photographic Experts Group), TIFF (Tagged Image File Format), decimation, etc. No particular compression technique or standard is needed, and any can be used, as long as the resulting compressed file retains enough information to allow for viewing and analysis.

In FIG. 2, the cloud service receives the original waveform from the test and measurement instrument at 50. It then stores the original waveform at 52, as the service may provide the original waveform if needed. At 54, the service compresses the waveform. In a simple embodiment, the system compresses the waveform and produces a file of a smaller size than the original waveform. In other embodiments, the service may compress the original waveform with various levels of compression at 55, resulting in a set of files that have different sizes, all smaller than the file size of the original waveform. Alternatively, or in addition, the service may segment the original waveform into smaller segments and store each segment at its original resolution at 56.

Once compressed, in whatever form, the users receive notification that the waveform has been shared at 58. Upon request from an authorized user, the service then transmits the compressed waveform to the user at 60. The users may then view the compressed waveform through a web browser, or a particular web browser application such as TekDrive™. This allows users to view the compressed waveform without having to download the entire waveform into a specialized software application, such as TekScope™.

One advantage of this technology is that once the service creates one or more compressed version of the multi-gigabyte waveform, multiple users can repeatedly consume it without creating as much stress on bandwidth and network resources as would occur if they all downloaded the original waveform. Multiple users from any location can view this data without requiring any application download. This makes collaboration practical and fast.

Figure 3:
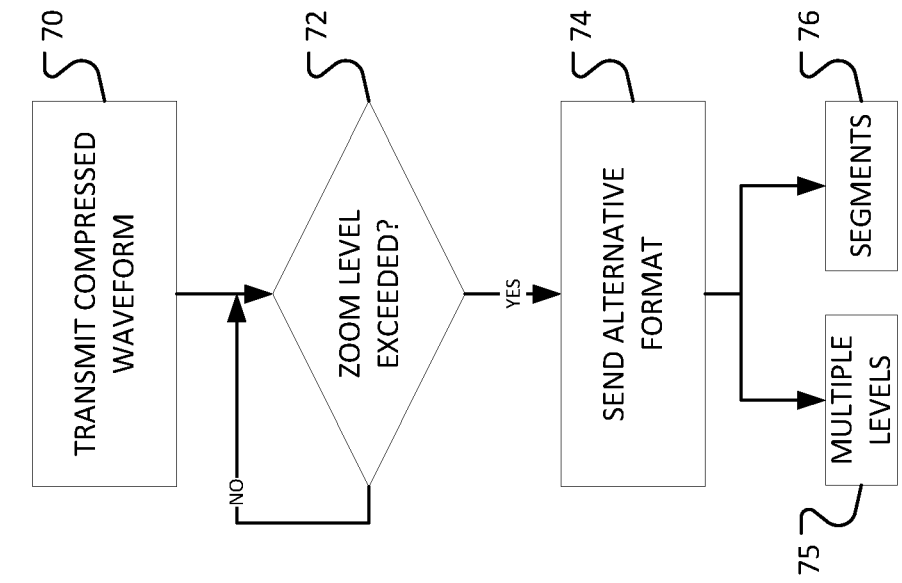
FIG. 3 shows a flowchart of an embodiment of delivering a compressed waveform file to a user device.

FIG. 3 shows an embodiment of a method of managing the waveform being downloaded by the user. The service transmits the compressed waveform to the user's web browser at 70. The service then monitors the user's interaction with the waveform to determine if the user has "over-zoomed" or exceeded a zoom threshold at 72. This means that the user has attempted to view the waveform at a higher magnification or zoom level than the compressed waveform can show.

The service can then send the waveform in one or more alternative formats at 74. In one embodiment, the service would send a less-compressed version of the waveform that shows the detail at the zoom level the user has selected at 75. As discussed previously, the service may apply multiple levels of compression of an original waveform to allow this response.

In another embodiment, the service may transmit a segment of the original waveform data corresponding to the segment of the waveform upon which the user zoomed at 76. The service may have segmented the waveform and stored the segments in their original, uncompressed form for just this reason.

In another embodiment, the service may transmit the entire original waveform. This may use the user's web browser, or the service may just notify the user to switch to the specific application. The system may also just notify the user that the zoom level has exceeded the "resolution" of the compression, allowing the use to make the choice of switching to the application or not.

However, it would seem more user friendly for the system to appear nearly instantly when requested. The switching between different compression level files, or segmented data sets, could happen in the background without any prompt or indication to the user that the service is switching the data sets. The user simply sees their waveform while maintaining high performance and a good experience. In this manner, the service allows users to share, view, analyze and zoom in on various waveforms transparently, while avoiding over burdening the system and the available bandwidth.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement device, comprising: a communications port configured to connect the test and measurement device to a network; a memory; and one or more processors configured to execute code to cause the processors to: receive an original waveform through the communications port, the original waveform having an identified file type; store the original waveform in the memory, the original waveform having an original file size; compress the original waveform to a compressed waveform having a compressed file size that is smaller than the original file size; notify one or more users that the compressed waveform is available; and upon receiving a request, transmitting the compressed waveform to a user device.

Example 2 is the test and measurement device of Example 1, wherein the code to cause the one or more processors to compress the original waveform comprises code to cause the one or more processors to compress the original waveform into multiple compressed waveforms, each compressed waveform having a different level of compression than other of the compressed waveforms.

Example 3 is the test and measurement device of either of Examples 1 or 2, the code further comprising code to cause the one or more processors to receive a signal from the user device indicating that a selected zoom level has exceeded a threshold zoom level.

Example 4 is the test and measurement device of Example 3, the code further comprising code to transmit one of either a compressed waveform having a compression level lower than compressed waveform being viewed by the user, or the original waveform, transparently to the user.

Example 5 is the test and measurement device of either of Examples 3 or 4, the code further comprising code to cause the one or more processors to send a message to the user device to notify the user that the threshold zoom level has been exceeded.

Example 6 is the test and measurement device of and of Examples 1 through 5, the code further comprising code to cause the one or more processors to divide the original waveform into multiple original segments and to store data for each original segment.

Example 7 is the test and measurement device of Example 6, the code further comprising code to cause the one or more processors to: receive a signal from the user device indicated that a selected zoom level has exceeded a threshold zoom level; determine a segment of the original waveform being viewed by the user; and transmit the data for the original segment to the user device.

Example 8 is the test and measurement device of any of Examples 1 through 7, wherein the code that causes the one or more processors to transmit the compressed waveform to a user device comprises code to cause the one or more processors to transmit the compressed waveform to multiple users.

Example 9 is the test and measurement device of any of Examples 1 through 8, wherein the code that causes the one or more processors to transmit the compressed waveform to a user device causes the one or more processors to transmit the compressed waveforms to the user device without requiring a dedicated application to view the compressed waveforms.

Example 10 is a method of providing waveform data across a network, comprising: receiving an original waveform through a communications port, the original waveform having an identified file type; storing the original waveform in a memory, the original waveform having an original file size; compressing the original waveform to a compressed waveform having a compressed file size that is smaller than the original file size; notifying one or more users that the compressed waveform is available; and upon receiving a request, transmit the compressed waveform to a user device.

Example 11 is the method of Example 10, wherein compressing the original waveform comprises compressing the original waveform at different levels of compression to produce multiple files, and store the multiple files.

Example 12 is the method of either of Examples 10 or 11, further comprising receiving a signal from the user device indicating that a selected zoom level has exceeded a threshold zoom level.

Example 13 is the method of Example 12, further comprising transmitting one of either a compressed waveform having a compression level lower than compressed waveform being viewed by the user, or the original waveform, transparently to the user.

Example 14 is the method of either of Example 12 or 13, further comprising sending a message to the user device to notify the user that the threshold zoom level has been exceeded.

Example 15 is the method of and of Examples 10 through 14, further comprising dividing the original waveform into multiple original segments and storing data for each original segment.

Example 16 is the method of Example 15, further comprising: receiving a signal from the user device indicating that a selected zoom level has exceeded a zoom level at which the compressed waveform is no longer equivalent to the original waveform; determining a segment of the original waveform being viewed by the user; and transmitting the data for the original segment to the user device.

Example 17 is the method of any of Example 10 through 16, wherein transmitting the compressed waveform to a user device comprises transmitting the compressed waveform to multiple users.

Example 18 is the method of Example 17, wherein the transmitting the compressed waveform to multiple users occurs one of simultaneously, partially simultaneously, or sequentially.

Example 19 is the method of and of Examples 10 through 17, wherein transmitting the compressed waveform to a user device comprises transmitting the compressed waveforms to the user device without requiring a dedicated application to view the compressed waveforms.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement system, comprising:
   a communications port configured to connect the test and measurement device to a network;
   a memory; and
   one or more processors configured to execute code to cause the processors to:
      receive an original waveform generated by a device under test across a network through the communications port, the original waveform having an identified file type;
      store the original waveform in the memory, the original waveform having an original file size, the memory comprising a memory on one or more servers as part of a cloud service;
      at least one of compress the original waveform to into multiple compressed waveforms, each compressed waveform having a different level of compression than other of the compressed waveforms, each compressed waveform having a compressed file size that is smaller than the original file size and store the multiple compressed waveforms in the memory and divide the original waveform into segments and store each segment separately, the file size for each segment being smaller than the file size of the original waveform;
      notify one or more users across the network that the compressed waveform is available;
      upon receiving a request from an authorized user across the network, transmitting the compressed waveforms to a user device across the network, resulting in reduced bandwidth when compared to sending the original waveform;
      monitor user interaction with the compressed waveform;
      determine that the user has exceeded an original zoom threshold for the compressed waveform transmitted to the user device; and
      automatically transmit one of either a different one of the multiple waveforms that has a lower compression, or a segment of the original waveform corresponding to an area of the compressed waveform being viewed by the user, to allow the user to zoom beyond the zoom threshold.

2. The test and measurement system as claimed in claim 1, the code that causes the one or more processors to transmit one of either a different one of the multiple waveforms that has a lower compression, comprises code to cause the one or more processors to transmit the original waveform, transparently to the user.

3. The test and measurement system as claimed in claim 1, the code further comprising code to cause the one or more processors to send a message to the user device to notify the user that the threshold zoom level has been exceeded.

4. The test and measurement system as claimed in claim 1, wherein the code that causes the one or more processors to transmit the compressed waveform to the user device comprises code to cause the one or more processors to transmit the compressed waveform to multiple users.

5. The test and measurement system as claimed in claim 1, wherein the code that causes the one or more processors to transmit the compressed waveform to the user device causes the one or more processors to transmit the compressed waveform to the user device without requiring a dedicated application to view the compressed waveform.

6. A method of providing waveform data across a network, comprising:
   receiving an original waveform transmitted across the network through a communications port, the original waveform having an identified file type;
   storing the original waveform in a memory, the original waveform having an original file size, the memory comprising a memory on one or more servers that comprise a cloud service;
   at least one of compressing the original waveform using one or more of the servers to a compressed waveform having a compressed file size that is smaller than the original file size and dividing the original waveform into segments and storing each segment separately, the file size for each segment being smaller than the file size of the original waveform;
   notifying one or more users across the network that the compressed waveform is available;
   upon receiving a request from an authorized user, transmit the compressed waveform across the network to a user device;
   monitoring user interaction with the compressed waveform;
   determining that the user has exceeded a zoom threshold for the compressed waveform transmitted to the user device; and
   automatically transmitting one of either a different one of the multiple waveforms that has a lower compression, or a segment of the original waveform corresponding to an area of the compressed waveform being viewed by the user, to allow the user to zoom beyond the zoom threshold.

7. The method as claimed in claim 6, wherein automatically transmitting one of either a compressed waveform having a compression level lower than compressed waveform being viewed by the user or a segment of the original waveform corresponding to an area of the compressed waveform being viewed by the user, comprises transmitting the original waveform, transparently to the user.

8. The method as claimed in claim 6, further comprising sending a message to the user device to notify the user that the threshold zoom level has been exceeded.

9. The method as claimed in claim 6, wherein transmitting the compressed waveform to the user device comprises transmitting the compressed waveform to multiple users.

10. The method as claimed in claim 9, wherein the transmitting the compressed waveform to multiple users occurs one of simultaneously, partially simultaneously, or sequentially.

11. The method as claimed in claim 6, wherein transmitting the compressed waveform to a user device comprises transmitting the compressed waveform to the user device without requiring a dedicated application to view the compressed waveform.

\* \* \* \* \*